US 11,649,559 B2

(12) United States Patent
Bao et al.

(10) Patent No.: US 11,649,559 B2
(45) Date of Patent: May 16, 2023

(54) METHOD OF UTILIZING A DEGASSING CHAMBER TO REDUCE ARSENIC OUTGASSING FOLLOWING DEPOSITION OF ARSENIC-CONTAINING MATERIAL ON A SUBSTRATE

(71) Applicant: Applied Materials, Inc., Santa Clara, CA (US)

(72) Inventors: Xinyu Bao, Fremont, CA (US); Chun Yan, San Jose, CA (US); Hua Chung, San Jose, CA (US); Schubert S. Chu, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/266,646

(22) Filed: Feb. 4, 2019

(65) Prior Publication Data
US 2019/0169767 A1 Jun. 6, 2019

Related U.S. Application Data

(62) Division of application No. 15/413,534, filed on Jan. 24, 2017, now abandoned.
(Continued)

(51) Int. Cl.
*C30B 25/16* (2006.01)
*C30B 25/08* (2006.01)
(Continued)

(52) U.S. Cl.
CPC ............ *C30B 25/08* (2013.01); *C23C 16/301* (2013.01); *C23C 16/4405* (2013.01);
(Continued)

(58) Field of Classification Search
CPC ......... C30B 25/00; C30B 25/02; C30B 25/08; C30B 25/10; C30B 25/105; C30B 25/12;
(Continued)

(56) References Cited

U.S. PATENT DOCUMENTS 6,007,624 A 12/1999 Wise
6,136,678 A 10/2000 Adetutu et al.
(Continued)

FOREIGN PATENT DOCUMENTS

CN 101548190 A 9/2009
KR 10-0827476 B1 5/2008
(Continued)

OTHER PUBLICATIONS

PCT Notification of Transmittal of the International Search Report and the Written Opinion of the International Searching Authority for International Application No. PCT/US2017/014609; dated Jun. 14, 2017; 9 total pages.
(Continued)

*Primary Examiner* — Kenneth A Bratland, Jr.
(74) *Attorney, Agent, or Firm* — Patterson + Sheridan, LLP

(57) ABSTRACT

Implementations of the present disclosure generally relate to the fabrication of integrated circuits. More specifically, implementations disclosed herein relate to apparatus, systems, and methods for reducing substrate outgassing. A substrate is processed in an epitaxial deposition chamber for depositing an arsenic-containing material on a substrate and then transferred to a degassing chamber for reducing arsenic outgassing on the substrate. The degassing chamber includes a gas panel for supplying hydrogen, nitrogen, and oxygen and hydrogen chloride or chlorine gas to the chamber, a substrate support, a pump, and at least one heating mechanism. Residual or fugitive arsenic is removed from the
(Continued)

substrate such that the substrate may be removed from the degassing chamber without dispersing arsenic into the ambient environment.

20 Claims, 4 Drawing Sheets

Related U.S. Application Data

(60) Provisional application No. 62/394,282, filed on Sep. 14, 2016.

(51) Int. Cl.
| | |
|---|---|
| *C30B 25/00* | (2006.01) |
| *C30B 33/00* | (2006.01) |
| *C23C 16/44* | (2006.01) |
| *C23C 16/30* | (2006.01) |
| *C23C 16/48* | (2006.01) |
| *C23C 16/56* | (2006.01) |
| *C30B 25/10* | (2006.01) |
| *C30B 25/12* | (2006.01) |
| *C30B 25/14* | (2006.01) |
| *C30B 29/40* | (2006.01) |
| *H01L 21/67* | (2006.01) |
| *C30B 35/00* | (2006.01) |
| *H01L 21/225* | (2006.01) |
| *H01L 21/30* | (2006.01) |
| *C30B 29/06* | (2006.01) |

(52) U.S. Cl.
CPC ............ *C23C 16/481* (2013.01); *C23C 16/56* (2013.01); *C30B 25/00* (2013.01); *C30B 25/105* (2013.01); *C30B 25/12* (2013.01); *C30B 25/14* (2013.01); *C30B 25/165* (2013.01); *C30B 29/40* (2013.01); *C30B 33/00* (2013.01); *C30B 35/00* (2013.01); *H01L 21/67167* (2013.01); *H01L 21/67196* (2013.01); *H01L 21/67207* (2013.01); *H01L 21/67253* (2013.01); *C30B 29/06* (2013.01); *H01L 21/2252* (2013.01); *H01L 21/30* (2013.01); *H01L 21/67201* (2013.01)

(58) Field of Classification Search
CPC ....... C30B 25/14; C30B 25/16; C30B 25/165; C30B 25/18; C30B 25/186; C30B 29/00; C30B 29/02; C30B 29/06; C30B 29/10; C30B 29/40; C30B 29/42; C30B 31/00; C30B 31/06; C30B 31/10; C30B 31/12; C30B 31/18; C30B 33/00; C30B 35/00; H01L 21/30; H01L 21/2252; H01L 21/67167; H01L 21/67196; H01L 21/67207; H01L 21/67253; H01L 21/67201
USPC ................. 117/84–86, 88, 94, 97, 102, 106, 117/200–202, 204, 928, 931, 935, 937, 117/954
See application file for complete search history.

(56) References Cited

U.S. PATENT DOCUMENTS

| | | | |
|---|---|---|---|
| 6,183,564 B1 | 2/2001 | Reynolds et al. | |
| 6,413,844 B1 * | 7/2002 | Beulens | C30B 31/06 438/565 |
| 7,064,073 B1 * | 6/2006 | U'ren | C23C 16/4405 134/1.1 |
| 8,999,798 B2 | 4/2015 | Taylor et al. | |
| 2003/0138562 A1 * | 7/2003 | Subramony | C23C 16/45512 427/255.394 |
| 2003/0224619 A1 * | 12/2003 | Ono | H01L 21/31662 438/771 |
| 2008/0153271 A1 | 6/2008 | Foad et al. | |
| 2009/0078871 A1 * | 3/2009 | Walther | H01L 21/67253 250/356.1 |
| 2009/0104740 A1 * | 4/2009 | Inokuchi | C23C 16/45523 257/E21.04 |
| 2010/0273291 A1 * | 10/2010 | Kryliouk | C23C 16/303 257/E51.001 |
| 2011/0097902 A1 * | 4/2011 | Singh | H01L 21/67201 257/E21.328 |
| 2011/0175140 A1 | 7/2011 | Taylor et al. | |
| 2011/0308453 A1 | 12/2011 | Su et al. | |
| 2014/0216342 A1 | 8/2014 | Yang et al. | |
| 2015/0056819 A1 | 2/2015 | Wong et al. | |
| 2015/0099350 A1 | 4/2015 | Srinivasan et al. | |

FOREIGN PATENT DOCUMENTS

| | | |
|---|---|---|
| KR | 20100106608 A | 10/2010 |
| KR | 20120107496 A | 10/2012 |
| KR | 20160065027 A | 6/2016 |
| TW | 201115643 A | 5/2011 |
| TW | 201517133 A | 5/2015 |

OTHER PUBLICATIONS

Taiwan Office Action dated Dec. 7, 2020 for Application No. 106121502.
Korean Office Action dated Oct. 24, 2022 for Application No. 10-2019-7010104.

* cited by examiner

METHOD OF UTILIZING A DEGASSING CHAMBER TO REDUCE ARSENIC OUTGASSING FOLLOWING DEPOSITION OF ARSENIC-CONTAINING MATERIAL ON A SUBSTRATE

CROSS-REFERENCE TO RELATED APPLICATIONS

This application is a divisional of U.S. application Ser. No. 15/413,534 filed on Jan. 24, 2017, which claims priority to U.S. Provisional Patent Application Ser. No. 62/394,282, filed on Sep. 14, 2016, both of which is herein incorporated by reference.

BACKGROUND

Field

Implementations of the present disclosure generally relate to the fabrication of integrated circuits. More specifically, implementations disclosed herein relate to systems, methods, and apparatus for reducing substrate outgassing.

Description of the Related Art

The manufacture of modern logic, memory, or integrated circuits typically includes more than four hundred process operations. A number of these operations are thermal processes that raise the temperature of the semiconductor substrate to a target value to induce rearrangement in the atomic order or chemistry of thin surface films (e.g., diffusion, oxidation, recrystallization, salicidation, densification, flow).

Ion implantation is a method for the introduction of chemical impurities in semiconductor substrates to form the p-n junctions necessary for field effect or bipolar transistor fabrication. Such impurities include P-type dopants, such as boron, aluminum, gallium, beryllium, magnesium, and zinc, and N-type dopants such as phosphorus, arsenic, antimony, bismuth, selenium, and tellurium. Ion implantation of chemical impurities disrupts the crystallinity of the semiconductor substrate over the range of the implant. At low energies, relatively little damage occurs to the substrate. However, the implanted dopants will not come to rest on electrically active sites in the substrate. Therefore, an anneal is required to restore the crystallinity of the substrate and drive the implanted dopants onto electrically active crystal sites.

During the processing of the substrate in, for example, an RTP chamber, the substrate may tend to outgas impurities implanted therein. These outgassed impurities may be the dopant material, a material derived from the dopant material, or any other material that may escape the substrate during the annealing process, such as the sublimation of silicon. The outgassed impurities may deposit on the colder walls and on the reflector plate of the chamber. This deposition may interfere with temperature pyrometer readings and with the radiation distribution fields on the substrate, which in turn affects the temperature at which the substrate is annealed. Deposition of the outgassed impurities may also cause unwanted particles on the substrates and may also generate slip lines on the substrate. Depending on the chemical composition of the deposits, the chamber is taken offline for a wet clean process.

Furthermore, one of the biggest challenges is to control the outgassing from the substrates after an arsenic doped silicon process, which is greater than the outgassing from the substrates during a III-V epitaxial growth process. Limitations in current outgassing control include that the thermal back process (>200 degrees Celsius) in either a process chamber or an etch chamber is not suitable after an arsenic doped silicon process, or other arsenic related process, as longer bake times for each substrate is necessary to drive out arsenic related outgassing gasses from the substrate surface and throughput is lowered. Furthermore, a long $N_2$ purge/pump cycle is less efficient and has a large impact on throughput. Testing has been performed on the prior known methods and results indicate that after ten cycles of pump/purge, arsenic outgassing was still detected at 1.9 parts per billion.

Absolute zero parts per billion (ppb) outgassing is typically desired for arsenic residuals due to arsenic toxicity. To minimize toxicity from arsenic outgassing during subsequent handling and processing of substrates, there is a need for improved systems, methods, and apparatus for reducing substrate outgassing.

SUMMARY

In one implementation, a system is disclosed. The system includes an epitaxial deposition chamber for depositing an arsenic-containing material on a substrate, a transfer chamber, and a degassing chamber for reducing arsenic outgassing on the substrate. Each of the epitaxial deposition chamber and the degassing chamber is connected to the transfer chamber. The degassing chamber for reducing arsenic outgassing on the substrate includes a plurality of chamber walls, a gas panel, at least one heating mechanism, a substrate support, a pump, and an arsenic detecting device. Each of the gas panel, the at least one heating mechanism, the substrate support, the pump, and the arsenic detecting device is connected to at least one of the plurality of chamber walls.

In another implementation, a method for reducing arsenic outgassing is disclosed. The method includes transferring a substrate from an epitaxial deposition chamber for depositing an arsenic-containing material on a substrate to a degassing chamber for reducing arsenic outgassing on the substrate, flowing hydrogen or nitrogen gas into the degassing chamber, ceasing the flow of hydrogen or nitrogen gas into the degassing chamber, flowing a mixture of oxygen and nitrogen gas into the degassing chamber to reduce arsenic outgassing on the substrate to a first amount, ceasing the flow of oxygen and nitrogen gas into the degassing chamber, flowing a chlorine-containing gas into the degassing chamber to clean the degassing chamber after the substrate is removed, and ceasing the flow of the chlorine-containing gas into the degassing chamber.

In yet another implementation, a method for reducing arsenic outgassing is disclosed. The method includes depositing an arsenic-containing material on a first substrate in an epitaxial deposition chamber, transferring the first substrate from the epitaxial deposition chamber to a degassing chamber, reducing arsenic outgassing on the first substrate, and depositing an arsenic-containing material on a second substrate in the epitaxial deposition chamber while reducing arsenic outgassing on the first substrate in the degassing chamber. The reducing arsenic outgassing includes flowing hydrogen or nitrogen gas into the degassing chamber, ceasing the flow of hydrogen or nitrogen gas into the degassing chamber, flowing a mixture of oxygen and nitrogen gas into the degassing chamber to reduce arsenic outgassing on the substrate to a first amount, ceasing the flow of oxygen and nitrogen gas into the degassing chamber, flowing a chlorine-containing gas into the degassing chamber clean the degassing chamber after the substrate is removed, ceasing the flow of the chlorine-containing gas into the degassing chamber, and detecting the amount of arsenic outgassing using an arsenic detecting device.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

To facilitate understanding, identical reference numerals have been used, wherever possible, to designate identical elements that are common to the Figures. Additionally, elements of one implementation may be advantageously adapted for utilization in other implementations described herein.

DETAILED DESCRIPTION

Implementations of the present disclosure generally relate to the fabrication of integrated circuits. More specifically, implementations disclosed herein relate to apparatus, systems, and methods for reducing substrate outgassing. A substrate is processed in an epitaxial deposition chamber for depositing an arsenic-containing material on a substrate and then transferred to a degassing chamber for reducing arsenic outgassing on the substrate. The degassing chamber includes a gas panel for supplying hydrogen, nitrogen, and oxygen and hydrogen chloride or chlorine gas to the chamber, a substrate support, a pump, and at least one heating mechanism. Residual or fugitive arsenic is removed from the substrate such that the substrate may be removed from the degassing chamber without dispersing arsenic into the ambient environment.

Figure 1:
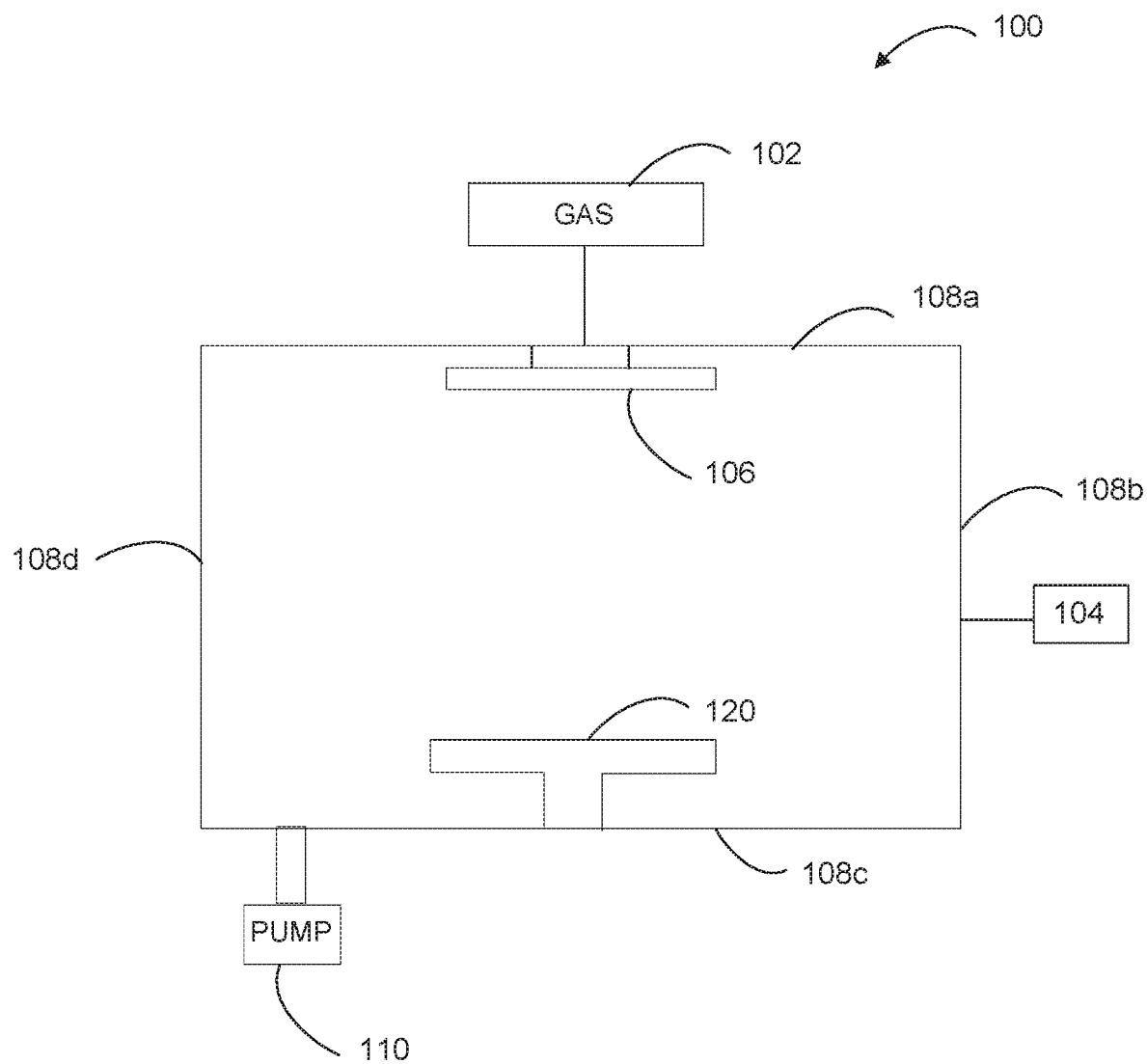
FIG. 1 illustrates a schematic view of a system for performing a method according to one implementation described herein.
Figure 2:
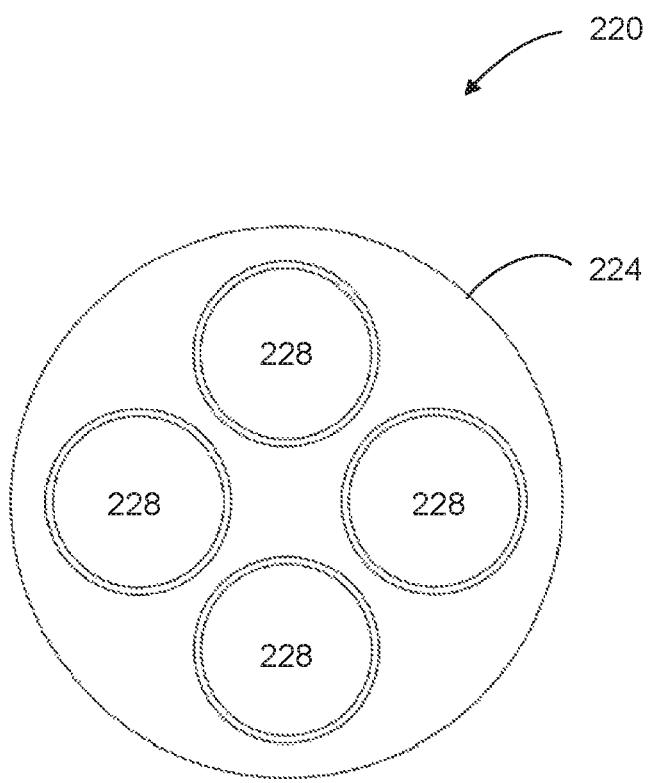
FIG. 2 illustrates a schematic, plan view of a substrate support according to one implementation described herein.

FIG. 1 illustrates a schematic, cross-sectional view of a degassing chamber 100 according to one implementation. The degassing chamber 100 includes a gas panel 102, at least one heating mechanism 106, a substrate support 120, and a pump 110. Each of the gas panel 102, the at least one heating mechanism 106, the substrate support 120, and the pump 110 is connected to at least one of the plurality of degassing chamber walls 108a, 108b, 108c, and 108d. The gas panel 102 is coupled to at least one of the chamber walls 108a, 108b, 108c, or 108d. In a preferred implementation, the gas panel 102 is configured to flow hydrogen, nitrogen, oxygen and chlorine gases into the degassing chamber 100. The at least one heating mechanism 106 is configured to provide gentle heat to the chamber 100. In one implementation, the at least one heating mechanism 106 is a lamp used for Infrared (IR) heating. In another implementation, the at least one heating mechanism 106 is a resistive heater in an overhead appliance. In one implementation, the substrate support 120 is configured to support a single substrate. In another implementation, the substrate support 120 may be configured to support a plurality of substrates, as shown in FIG. 2 and discussed below. In one implementation, the one or more substrates may be circular substrates. For example, the substrate may be a 200 millimeter (mm) circular substrate, a 300 mm circular substrate, or a 450 mm circular substrate. In another implementation, the one or more substrates may be non-circular substrates. In one implementation, the pump 110 is configured to remove residual gases and materials from the degassing chamber 100.

Additionally, in one implementation, the degassing chamber 100 includes an arsenic detecting device 104, which is coupled to at least one of the chamber walls 108a, 108b, 108c, or 108d. The arsenic detecting device 104 may be used to detect arsenic concentration. More particularly, the arsenic detecting device 104 may be used for example, for detecting an arsenic endpoint based on a concentration of arsenic, based on a concentration of arsenic over a period of time (integral), or based on a rate of change of arsenic (derivative).

FIG. 2 illustrates a schematic, plan view of a substrate support 220 according to one implementation. The substrate support 220 may be the substrate support 120 shown in FIG. 1. As illustrated, the annular ring 224 is configured to support a plurality of substrates 228 in positions discrete from one another. In one implementation, the annular ring 224 is disc-shaped. Although four substrates 228 are illustrated, it is contemplated that a greater or lesser number of substrates 228 may be supported by the annular ring 224. In an alternative implementation, the substrate support 220 may be arranged as a barrel-style substrate support configured to support a plurality of substrates. If the substrate support 220 were a barrel-style substrate support, the entire substrate support may be heated using the heating mechanism 106 such that all substrates in the barrel-style substrate support are adequately heated to reduce arsenic outgassing.

Figure 3:
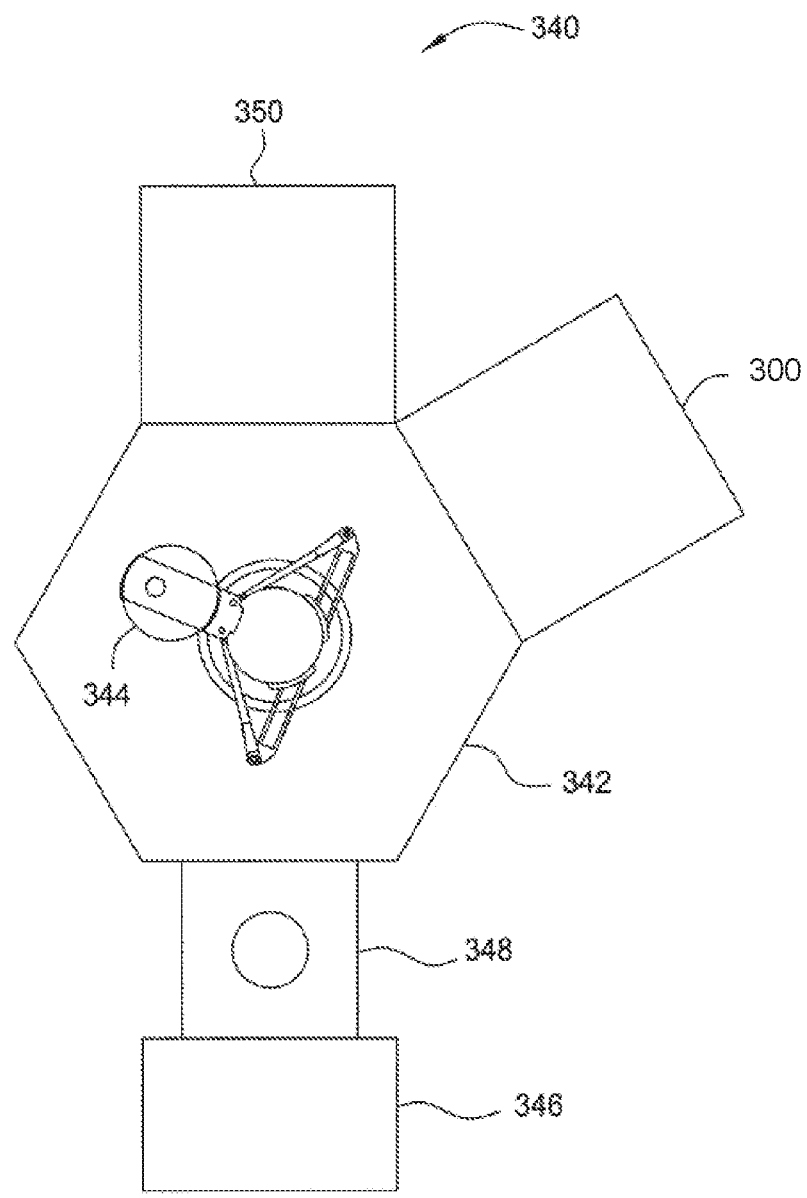
FIG. 3 illustrates a schematic, plan view of a system for performing a method according to one implementations described herein.

FIG. 3 illustrates a schematic view of a system 340 for performing a method according to one implementation described herein. More specifically, the system 340 is a cluster tool for fabricating semiconductor devices according to the methods described above. The system 340 includes an epitaxial deposition chamber 350, a degassing chamber 300, and a central portion of the system 340, which is a transfer chamber 342. Within the transfer chamber 342 is a substrate transferring mechanism 344. Additionally a load lock chamber 346 is included for loading substrates into the system 340. The epitaxial deposition chamber 350 and the degassing chamber 300 are connected to the transfer chamber 342. The load lock chamber 346 is connected to the transfer chamber 342 through a substrate alignment chamber 348. In a preferred implementation, the epitaxial deposition chamber 350 may be a commercially available process chamber, such as the Centura® RP Epi reactor, available from Applied Materials, Inc. of Santa Clara, Calif., the Producer® Epi reactor, available from Applied Materials, Inc. of Santa Clara, Calif., or any suitable semiconductor process chamber adapted for performing epitaxial deposition processes. In a preferred implementation, the degassing chamber 300 may be the degassing chamber 100 described above and shown in FIG. 1, or any suitable degassing chamber adapted for reducing arsenic outgassing.

In operation, once a substrate is processed in the epitaxial deposition chamber 350, the substrate will be directly transferred to the degassing chamber 300. While the epitaxial deposition chamber 350 may be depositing on one substrate, the degassing chamber 300 may be degassing, as described below and shown in FIG. 4, another substrate that has already been processed by an epitaxial deposition chamber, such as the epitaxial deposition chamber 350. Thus, throughput is increased because the epitaxial deposition chamber 350 may not need down time for cleaning, as may be necessary if both the depositing and degassing were being performed in the epitaxial deposition chamber 350.

While the foregoing contemplates a single epitaxial deposition chamber 350 and a single degassing chamber 300, the system 340 may further include additional epitaxial deposition chambers, additional degassing chambers, and any additional substrate processing chambers.

In another implementation, the epitaxial deposition chamber 350 may be incorporated onto a first platform and the degassing chamber 300, which may be the degassing chamber 100, may be incorporated onto a second platform rather than being incorporated into a single cluster tool system. In this alternative implementation, the substrate may be transferred from the epitaxial deposition chamber 350 to a Front Opening Unified Pod (FOUP) and then to the degassing chamber 300.

Figure 4:
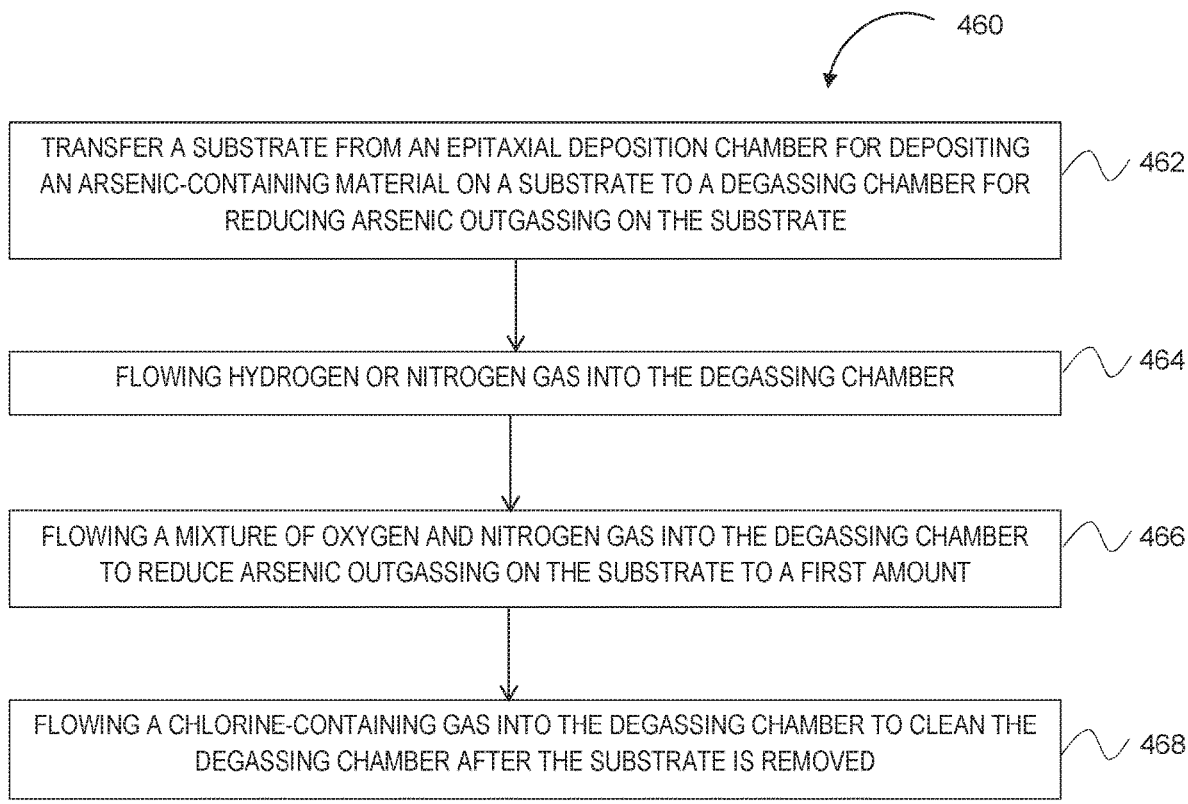
FIG. 4 illustrates a flow diagram summarizing a method according to one implementation described herein.

FIG. 4 illustrates a flow diagram summarizing a method 460 according to one implementation described herein. Prior to the first operation, operation 462, of the method 460, a substrate may be processed in an epitaxial deposition chamber, for example the epitaxial deposition chamber 350 shown in FIG. 3. During the processing, outgassing may occur. More specifically, the substrate may tend to outgas impurities implanted therein, for example, the arsenic dopant material deposited during an arsenic doped silicon, or other arsenic-related process. This outgassing may cause unwanted particles on the substrate.

At operation 462, a substrate is transferred from an epitaxial deposition chamber for depositing an arsenic-containing material on the substrate, such as the epitaxial deposition chamber 350 shown in FIG. 3, to a degassing chamber for reducing arsenic outgassing on the substrate, such as the degassing chamber 300 shown in FIG. 3, which may be the degassing chamber 100 described above and shown in FIG. 1.

At operation 464, a hydrogen or nitrogen gas is flowed into the degassing chamber 300. By flowing the hydrogen or nitrogen gas into the degassing chamber 300, arsenic may be volatilized from the surface of the substrate. During operation 464, heat may be used to remove arsenic from the substrate and then the hydrogen or nitrogen gas may remove the arsenic from the chamber 300. In one implementation, the hydrogen or nitrogen gas may be a hydrogen gas, such as $H_2$. In another implementation, the hydrogen or nitrogen gas may be a nitrogen gas, such as $N_2$. In yet another implementation, the hydrogen or nitrogen gas may be an inert gas, which may be non-reactive to an epitaxially deposited film. Prior to operation 464, the substrate is heated to a temperature between about 500 degrees Celsius (° C.) to about 700° C., for example about 600° C. The temperature may be then be maintained at a constant temperature of about 600° C. for the remainder of the method 460, which increases system throughput by reducing the time lost to ramping the temperature up or down.

In one implementation, during operation 464, the hydrogen or nitrogen gas may be continuously flowed into the degassing chamber 300. In another implementation, during operation 464, the hydrogen or nitrogen gas may be discontinuously flowed into the degassing chamber 300. The flow rate of the hydrogen or nitrogen gas, in one implementation, may be between about 10 standard liters per minute (slm) and about 30 slm. A higher flow rate may be used to create a large concentration gradient to drive arsenic into the purge gas. During this process, the pressure in the degassing chamber 300 may be a low pressure. In one implementation, the pressure may be between about 1 Torr and about 100 Torr. The hydrogen or nitrogen gas may be flowed into the degassing chamber 300 for between about 1 minute and about 10 minutes.

One implementation may feature a short pressure reduction operation to accelerate removal of arsenic from the substrate surface. A pressure control member, such as a throttle valve used to control back pressure in the chamber 300, may be opened for about 5 to about 30 seconds, gas flow may be stabilized to remove the additional arsenic extracted from the substrate, and the throttle valve may then be pinched back to restore pressure in the chamber 300. The hydrogen or nitrogen gas flow into the degassing chamber 300 may then be ceased.

At operation 466, a mixture of oxygen and nitrogen gas, or oxidation gas, is flowed into the degassing chamber, such as the degassing chamber 300 shown in FIG. 3, which may be the degassing chamber 100 described above and shown in FIG. 1 to reduce arsenic outgassing on the substrate to a first amount. During this operation, heat and exposure to oxygen-containing gas adds oxygen to the substrate surface to form silicon (or other semiconductor) oxides. This encases any residual arsenic in an oxide matrix and substantially passivates the surface. In one implementation, the mixture of oxygen gas and nitrogen gas, or oxidation gas, may be an oxygen gas, such $O_2$ or a nitrogen gas, such as $N_2$, or a mixture of $O_2$ and $N_2$. In another implementation, the mixture of oxygen and nitrogen gas may be $NO_2$ or $H_2O$. In one implementation the $O_2$ percentage by volume in $N_2$ may be between about 0.1% and about 1%. In one implementation, $N_2$ may be flowed into the degassing chamber 300 and then $O_2$ may be flowed into the degassing chamber 300 for several minutes. During this operation, the temperature may be between about 100° C. and about 300°. While $O_2$ is flowing into the degassing chamber 300, the pressure may be raised to between about 80 Torr and about 300 Torr. Raising the pressure while $O_2$ is flowing into the degassing chamber 300 allows $O_2$ to remain on the substrate surface for a longer period of time, thus resulting in increased oxidation. $N_2$ may then be flowed into the degassing chamber 300 at a lower pressure of less than about 20 Torr to purge the chamber 300. The flow of oxygen and nitrogen gas into the degassing chamber may then be ceased.

At operation 468, a chlorine-containing gas is flowed into the degassing chamber 300 to clean the degassing chamber 300 after the substrate is removed. More specifically, the chlorine-containing gas removes the residual arsenic adsorbed inside the surface of the degassing chamber 300 during the degassing process. This cleaning assures low arsenic background in the degassing chamber 300. High arsenic background in the degassing chamber 300 may reduce the degassing effectiveness.

Thus, apparatus, systems, and methods for reducing substrate outgassing are provided. The disclosed separate degassing chamber enables reduced arsenic outgassing. Benefits of this disclosure include reduction of arsenic outgassing to zero (i.e., undetectable levels) while increasing throughput because substrates may be processed in parallel. Specifically, epitaxial deposition may be performed on one substrate in the epitaxial deposition chamber while another substrate undergoes degassing to reduce arsenic outgassing in the dedicated degassing chamber in parallel.

While the foregoing is directed to implementations of the present disclosure, other and further implementations of the disclosure may be devised without departing from the basic scope thereof, and the scope thereof is determined by the claims that follow.

What is claimed is:

1. A method for reducing arsenic outgassing, comprising:
transferring a substrate having an arsenic-containing material formed thereon from an epitaxial deposition chamber for depositing the arsenic-containing material on the substrate to a degassing chamber for reducing arsenic outgassing on the substrate;
heating the degassing chamber with the substrate therein and maintaining a constant temperature within the degassing chamber while:
providing a flow of hydrogen or nitrogen gas into the degassing chamber, wherein providing the flow of hydrogen or nitrogen gas into the degassing chamber occurs at a first pressure between 1 Torr and 100 Torr;
reducing pressure in the degassing chamber from the first pressure to a second pressure for 5 to 30 seconds to stabilize the flow of hydrogen or nitrogen gas and remove arsenic extracted from the substrate;
restoring pressure in the degassing chamber from the second pressure to the first pressure;
ceasing the flow of hydrogen or nitrogen gas into the degassing chamber;
flowing oxygen and nitrogen gas into the degassing chamber to form silicon oxide film on the substrate surface and to reduce arsenic outgassing on the substrate to a first amount of arsenic;
ceasing the flow of oxygen and nitrogen gas into the degassing chamber;
flowing a chlorine-containing gas into the degassing chamber to clean the degassing chamber after the substrate is removed; and
ceasing the flow of the chlorine-containing gas into the degassing chamber.

2. The method of claim 1, further comprising detecting the first amount of arsenic outgassing.

3. The method of claim 1, wherein a temperature in the degassing chamber is between 500° C. and 700° C.

4. The method of claim 1, wherein providing the flow of hydrogen or nitrogen gas into the degassing chamber occurs for between 1 minute and 10 minutes at a flow rate between 10 slm and 30 slm.

5. The method of claim 1, wherein flowing oxygen and nitrogen gas into the degassing chamber to reduce arsenic outgassing on the substrate to the first amount comprises:
flowing nitrogen gas into the degassing chamber;
flowing oxygen gas into the degassing chamber after flowing nitrogen gas into the degassing chamber; and
flowing nitrogen gas into the degassing chamber after flowing oxygen gas into the degassing chamber.

6. The method of claim 5, wherein flowing oxygen gas into the degassing chamber occurs at a pressure between 80 Torr and 300 Torr.

7. The method of claim 6, wherein flowing nitrogen gas into the degassing chamber after flowing oxygen gas into the degassing chamber occurs at a pressure less than 20 Torr.

8. A method for reducing arsenic outgassing, comprising:
depositing an arsenic-containing material on a first substrate in an epitaxial deposition chamber;
transferring the first substrate from the epitaxial deposition chamber to a degassing chamber;
reducing arsenic outgassing on the first substrate, wherein reducing arsenic outgassing comprises:
heating the degassing chamber with the substrate therein and maintaining a constant temperature within the degassing chamber while:
providing a flow of hydrogen or nitrogen gas into the degassing chamber, wherein providing the flow of hydrogen or nitrogen gas into the degassing chamber occurs at a first pressure between 1 Torr and 100 Torr;
reducing pressure in the degassing chamber from the first pressure to a second pressure for 5 to 30 seconds to stabilize the flow of hydrogen or nitrogen gas and remove arsenic extracted from the first substrate;
restoring pressure in the degassing chamber from the second pressure to the first pressure;
ceasing the flow of hydrogen or nitrogen gas into the degassing chamber;
flowing oxygen and nitrogen gas into the degassing chamber to form silicon oxide film on the substrate surface and to reduce arsenic outgassing on the first substrate to a first amount of arsenic;
ceasing the flow of oxygen and nitrogen gas into the degassing chamber;
flowing a chlorine-containing gas into the degassing chamber to clean the degassing chamber after the first substrate is removed;
ceasing the flow of the chlorine-containing gas into the degassing chamber; and
detecting the first amount of arsenic; and
depositing an arsenic-containing material on a second substrate in the epitaxial deposition chamber while reducing arsenic outgassing on the first substrate in the degassing chamber.

9. The method of claim 8, wherein a temperature in the degassing chamber is between 500° C. and 700° C.

10. The method of claim 8, wherein providing the flow of hydrogen or nitrogen gas into the degassing chamber occurs for between 1 minute and 10 minutes at a flow rate between 10 slm and 30 slm.

11. The method of claim 8, wherein flowing oxygen and nitrogen gas into the degassing chamber to reduce arsenic outgassing on the first substrate to the first amount comprises:
flowing nitrogen gas into the degassing chamber;
flowing oxygen gas into the degassing chamber after flowing nitrogen gas into the degassing chamber; and
flowing nitrogen gas into the declassing chamber after flowing oxygen gas into the degassing chamber.

12. The method of claim 11, wherein flowing oxygen gas into the degassing chamber occurs at a pressure between 80 Torr and 300 Torr.

13. The method of claim 12, wherein flowing nitrogen gas into the degassing chamber after flowing oxygen gas into the degassing chamber occurs at a pressure less than 20 Torr.

14. A method for reducing arsenic outgassing, comprising:
transferring a substrate having an arsenic-containing material formed thereon from an epitaxial deposition chamber for depositing the arsenic-containing material on the substrate to a degassing chamber for reducing arsenic outgassing on the substrate;

heating the degassing chamber with the substrate therein and maintaining a constant temperature within the degassing chamber while:
provide a flow of hydrogen or nitrogen gas into the degassing chamber, wherein providing the flow of hydrogen or nitrogen gas into the degassing chamber occurs at a first pressure between 1 Torr and 100 Torr;
reducing pressure in the degassing chamber from the first pressure to a second pressure for 5 to 30 seconds to stabilize the flow of hydrogen or nitrogen gas and remove arsenic extracted from the substrate;
restoring pressure in the degassing chamber from the second pressure to the first pressure;
ceasing the flow of hydrogen or nitrogen gas into the degassing chamber;
flowing oxygen and nitrogen gas into the degassing chamber to form silicon oxide film on the substrate surface and to reduce arsenic outgassing on the substrate to a first amount;
ceasing the flow of oxygen and nitrogen gas into the degassing chamber;
removing the substrate from the degassing chamber after ceasing the flow of the oxygen and nitrogen gas;
flowing a chlorine-containing gas into the degassing chamber to clean the degassing chamber after the substrate is removed;
ceasing the flow of the chlorine-containing gas into the degassing chamber; and
detecting an endpoint based on a concentration of arsenic within the degassing chamber.

15. The method of claim 14, wherein detecting the endpoint includes one of detecting the concentration of arsenic over a period of time and detecting a rate of change of arsenic concentration.

16. The method of claim 14, wherein a temperature in the degassing chamber is between 500° C. and 700° C.

17. The method of claim 14, wherein providing the flow of hydrogen or nitrogen gas into the degassing chamber occurs for between 1 minute and 10 minutes at a flow rate between 10 slm and 30 slm.

18. The method of claim 14, wherein flowing the oxygen and nitrogen gas into the degassing chamber to reduce arsenic outgassing on the substrate to the first amount comprises:
flowing nitrogen gas into the degassing chamber;
flowing oxygen gas into the degassing chamber after lowing nitrogen gas into the degassing chamber; and
flowing nitrogen gas into the degassing chamber after flowing oxygen gas into the degassing chamber.

19. The method of claim 18, wherein flowing oxygen gas into the degassing chamber occurs at a pressure between 80 Torr and 300 Torr.

20. The method of claim 19, wherein flowing nitrogen gas into the degassing chamber after flowing oxygen gas into the degassing chamber occurs at a pressure less than 20 Torr.

* * * * *